(12) United States Patent
Yamamoto

(10) Patent No.: US 6,985,655 B2
(45) Date of Patent: Jan. 10, 2006

(54) COMPOSITIONS AND METHODS INVOLVING DIRECT WRITE OPTICAL LITHOGRAPHY

(75) Inventor: Melvin Yamamoto, Fremont, CA (US)

(73) Assignee: Affymetrix, Inc., Santa Clara, CA (US)

( * ) Notice: Subject to any disclaimer, the term of this patent is extended or adjusted under 35 U.S.C. 154(b) by 268 days.

(21) Appl. No.: 10/318,838

(22) Filed: Dec. 12, 2002

(65) Prior Publication Data

US 2004/0008811 A1 Jan. 15, 2004

Related U.S. Application Data

(60) Provisional application No. 60/319,107, filed on Jan. 30, 2002.

(51) Int. Cl.
*G02B 6/32* (2006.01)

(52) U.S. Cl. ............... 385/34; 385/114; 385/120
(58) Field of Classification Search ......... 385/115, 385/147, 33, 34, 114, 120; 347/234; 264/85; 430/315
See application file for complete search history.

(56) References Cited

U.S. PATENT DOCUMENTS

| | | | | | |
|---|---|---|---|---|---|
| 4,590,492 | A | * | 5/1986 | Meier | 347/242 |
| 4,899,195 | A | * | 2/1990 | Gotoh | 355/77 |
| 5,204,224 | A | * | 4/1993 | Suzuki | 430/315 |
| 5,852,699 | A | * | 12/1998 | Lissotschenko et al. | 385/115 |
| 5,932,315 | A | * | 8/1999 | Lum et al. | 428/172 |
| 6,111,381 | A | * | 8/2000 | Frick et al. | 318/558 |
| 6,377,739 | B1 | * | 4/2002 | Richardson et al. | 385/115 |
| 6,570,642 | B2 | * | 5/2003 | Huang et al. | 355/67 |
| 6,707,535 | B2 | * | 3/2004 | Sato et al. | 355/53 |
| 2001/0004265 | A1 | * | 6/2001 | Kurematsu | 347/234 |
| 2004/0150129 | A1 | * | 8/2004 | Hougham et al. | 264/85 |

* cited by examiner

*Primary Examiner*—Ellen E. Kim
(74) *Attorney, Agent, or Firm*—Wei Zhou; Philip L. McGarrigle

(57) ABSTRACT

In one embodiment, fiber optic arrays or bundles are used as a light guide to transmit ultraviolet light to the substrate surface for photo-directed polymer synthesis. Digital Micromirror Array (DMA) is used as a switching device to reflect light onto the entry side of the fiber optic array.

17 Claims, 6 Drawing Sheets

COMPOSITIONS AND METHODS INVOLVING DIRECT WRITE OPTICAL LITHOGRAPHY

RELATED APPLICATIONS

This application claims the priority to U.S. Provisional Application No. 60/319,107, filed on Jan. 30, 2002. This application is also related to U.S. Pat. No. 6,271,957, issued Aug. 7, 2001. All cited applications are incorporated herein by reference.

BACKGROUND OF THE INVENTION

This invention relates to optical lithography and more particularly to direct write optical lithography.

Polymer arrays, such as the GeneChip® probe array (Affymetrix, Inc., Santa Clara, Calif.), can be synthesized using light-directed methods described, for example, in U.S. Pat. Nos. 5,424,186; 5,510,270; 5,800,992; 5,445,934; 5,744,305; 5,384,261 and 5,677,195 and PCT published application no. WO 95/11995, which are hereby incorporated by reference in their entireties. In many cases a different mask having a particular predetermined image pattern is used for each separate photomasking step, and synthesis of a wafer containing many chips requires a plurality of photomasking steps with different image patterns. For example, synthesis of an array of 20 mers typically requires approximately seventy photolithographic steps and related unique photomasks. So, using present photolithographic systems and methods, a plurality of different image pattern masks must be pre-generated and changed in the photolithographic system at each photomasking step. Thus, a photolithographic system and method that does not require such masks may be useful in providing a more efficient and simplified lithographic process.

SUMMARY OF THE INVENTION

According to a second aspect of the invention, polymer array synthesis is performed using a system with a transmissive spatial light modulator and without a lens and photomask.

According to another aspect of the invention, a Direct Write System transmits image patterns to be formed on the surface of a substrate (e.g., a wafer). The image patterns are stored in a computer. The Direct Write System projects light patterns generated from the image patterns onto a surface of the substrate for light-directed polymer synthesis (e.g., oligonucleotide). The light patterns are generated by a spatial light modulator controlled by a computer, rather than being defined by a pattern on a photomask. Thus, in the Direct Write System each pixel is illuminated with an optical beam of suitable intensity and the imaging (printing) of an individual feature on a substrate is determined dynamically by computer control.

According to a further aspect of the invention, polymer array synthesis is accomplished using a class of devices known as spatial light modulators to define the image pattern of the polymer array to be deprotected.

In another embodiment, fiber optic arrays or bundles are used as a light guide to transmit ultraviolet light to the substrate surface. A Digital Micromirror Array (DMA) is used as a switching device to reflect light onto the entry side of the fiber optic array. Since the DMA can selectively reflect light at individual mirrors or pixels, only specific fiber elements will be illuminated. The light that exits the other end of the fiber array will illuminate selected locations on the substrate.

In some embodiments, the use of spherical lens on the entry and exit ends of the fibers can enhance the collection and focus of light as well. On the entry end, the relative narrow collection angle of a conventional fiber may not be efficient enough to transmit sufficient light intensity to the substrate surface. On the exit end of the fiber a large angle of light scatter is typically expected. The addition of spherical lenses bonded to a concave surface on the end of the fiber may be beneficial.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
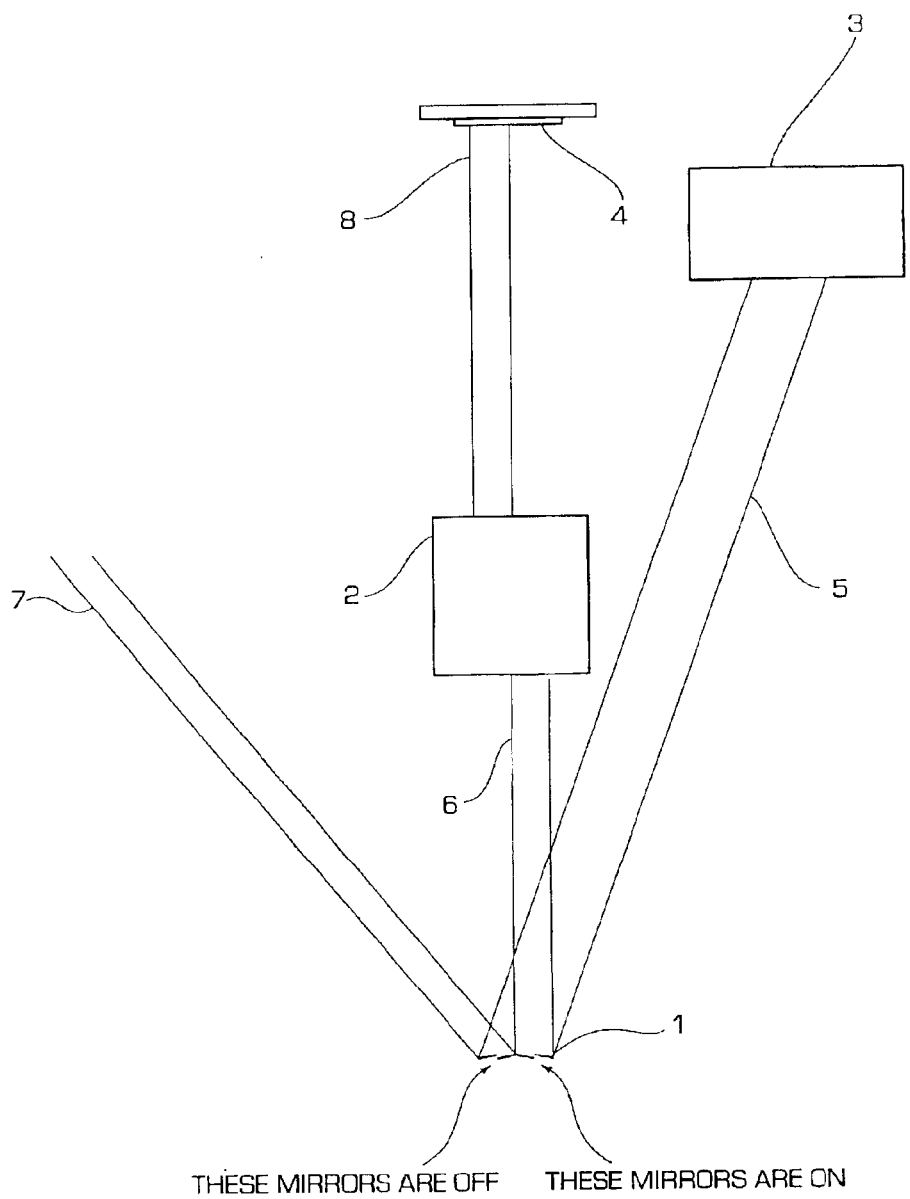
FIG. 1 shows a first embodiment of the invention having a light source, a reflective spatial light modulator, such as a micromirror array, and a lens.

The present invention has many preferred embodiments and relies on many patents, applications and other references for details known to those of the art. Therefore, when a patent, application, or other reference is cited or repeated below, it should be understood that it is incorporated by reference in its entirety for all purposes as well as for the proposition that is recited.

I. General

As used in this application, the singular form "a," "an," and "the" include plural references unless the context clearly dictates otherwise. For example, the term "an agent" includes a plurality of agents, including mixtures thereof.

An individual is not limited to a human being but may also be other organisms including but not limited to mammals, plants, bacteria, or cells derived from any of the above.

Throughout this disclosure, various aspects of this invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

The practice of the present invention may employ, unless otherwise indicated, conventional techniques and descriptions of organic chemistry, polymer technology, molecular biology (including recombinant techniques), cell biology, biochemistry, and immunology, which are within the skill of the art. Such conventional techniques include polymer array synthesis, hybridization, ligation, and detection of hybridization using a label. Specific illustrations of suitable techniques can be had by reference to the example herein below. However, other equivalent conventional procedures can, of course, also be used. Such conventional techniques and descriptions can be found in standard laboratory manuals such as Genome Analysis: A Laboratory Manual Series (Vols. I–IV), Using Antibodies: A Laboratory Manual, Cells: A Laboratory Manual, PCR Primer: A Laboratory Manual, and Molecular Cloning: A Laboratory Manual (all from Cold Spring Harbor Laboratory Press), Stryer, L. (1995) Biochemistry (4th Ed.) Freeman, New York, Gait, "Oligonucleotide Synthesis: A Practical Approach" 1984, IRL Press, London, Nelson and Cox (2000), Lehninger, Principles of Biochemistry 3rd Ed., W. H. Freeman Pub., New York, N.Y. and Berg et al. (2002) Biochemistry, 5th Ed., W. H. Freeman Pub., New York, N.Y., all of which are herein incorporated in their entirety by reference for all purposes.

The present invention can employ solid substrates, including arrays in some preferred embodiments. Methods and techniques applicable to polymer (including protein) array synthesis have been described in U.S. Ser. No. 09/536,841, WO 00/58516, U.S. Pat. Nos. 5,143,854, 5,242,974, 5,252,743, 5,324,633, 5,384,261, 5,405,783, 5,424,186, 5,451,683, 5,482,867, 5,491,074, 5,527,681, 5,550,215, 5,571,639, 5,578,832, 5,593,839, 5,599,695, 5,624,711, 5,631,734, 5,795,716, 5,831,070, 5,837,832, 5,856,101, 5,858,659, 5,936,324, 5,968,740, 5,974,164, 5,981,185, 5,981,956, 6,025,601, 6,033,860, 6,040,193, 6,090,555, 6,136,269, 6,269,846 and 6,428,752, in PCT Applications Nos. PCT/US99/00730 (International Publication Number WO 99/36760) and PCT/US01/04285, which are all incorporated herein by reference in their entirety for all purposes.

Patents that describe synthesis techniques in specific embodiments include U.S. Pat. Nos. 5,412,087, 6,147,205, 6,262,216, 6,310,189, 5,889,165, and 5,959,098. Nucleic acid arrays are described in many of the above patents, but the same techniques are applied to polypeptide arrays which are also described.

Nucleic acid arrays that are useful in the present invention include those that are commercially available from Affymetrix, Inc. (Santa Clara, Calif.) under the trademark GeneChip®. Example arrays are shown on the website at affymetrix.com. The present invention also contemplates many uses for polymers attached to solid substrates. These uses include gene expression monitoring, profiling, library screening, genotyping and diagnostics. Illustrative gene expression monitoring, and profiling methods are shown in U.S. Pat. Nos. 5,800,992, 6,013,449, 6,020,135, 6,033,860, 6,040,138, 6,177,248 and 6,309,822. Illustrative genotyping and uses therefore are shown in U.S. Ser. Nos. 60/319,253, 10/013,598, and U.S. Pat. Nos. 5,856,092, 6,300,063, 5,858,659, 6,284,460, 6,361,947, 6,368,799 and 6,333,179. Other uses are embodied in U.S. Pat. Nos. 5,871,928, 5,902,723, 6,045,996, 5,541,061, and 6,197,506.

The present invention also contemplates sample preparation methods in certain preferred embodiments. Prior to or concurrent with genotyping, the genomic sample may be amplified by a variety of mechanisms, some of which may employ PCR. See, e.g., PCR Technology: Principles and Applications for DNA Amplification (Ed. H. A. Erlich, Freeman Press, NY, N.Y., 1992); PCR Protocols: A Guide to Methods and Applications (Eds. Innis, et al., Academic Press, San Diego, Calif., 1990); Mattila et al., Nucleic Acids Res. 19, 4967 (1991); Eckert et al., PCR Methods and Applications 1, 17 (1991); PCR (Eds. McPherson et al., IRL Press, Oxford); and U.S. Pat. Nos. 4,683,202, 4,683,195, 4,800,159 4,965,188, and 5,333,675, and each of which is incorporated herein by reference in their entireties for all purposes. The sample may be amplified on the array. See, for example, U.S. Pat. No. 6,300,070 and U.S. patent application Ser. No. 09/513,300, which are incorporated herein by reference.

Other suitable amplification methods include the ligase chain reaction (LCR) (e.g., Wu and Wallace, Genomics 4, 560 (1989), Landegren et al., Science 241, 1077 (1988) and Barringer et al. Gene 89:117 (1990)), transcription amplification (Kwoh et al., Proc. Natl. Acad. Sci. USA 86, 1173 (1989) and WO88/10315), self sustained sequence replication (Guatelli et al., Proc. Nat. Acad. Sci. USA, 87, 1874 (1990) and WO90/06995), selective amplification of target polynucleotide sequences (U.S. Pat. No. 6,410,276), consensus sequence primed polymerase chain reaction (CP-PCR) (U.S. Pat. No. 4,437,975), arbitrarily primed polymerase chain reaction (AP-PCR) (U.S. Pat. Nos. 5,413,909, 5,861,245) and nucleic acid based sequence amplification (NABSA). (See, U.S. Pat. Nos. 5,409,818, 5,554,517, and 6,063,603, each of which is incorporated herein by reference). Other amplification methods that may be used are described in, U.S. Pat. Nos. 5,242,794, 5,494,810, 4,988,617 and in U.S. patent application Ser. No. 09/854,317, each of which is incorporated herein by reference.

Additional methods of sample preparation and techniques for reducing the complexity of a nucleic sample are described in Dong et al., Genome Research 11, 1418 (2001), in U.S. Pat. Nos. 6,361,947, 6,391,592 and U.S. patent application Ser. Nos. 09/916,135, 09/920,491, 09/910,292, and 10/013,598, which are incorporated herein by reference for all purposes.

Methods for conducting polynucleotide hybridization assays have been well developed in the art. Hybridization assay procedures and conditions will vary depending on the application and are selected in accordance with the general binding methods known including those referred to in: Maniatis et al. Molecular Cloning: A Laboratory Manual (2nd Ed. Cold Spring Harbor, N.Y, 1989); Berger and Kimmel Methods in Enzymology, Vol. 152, Guide to Molecular Cloning Techniques (Academic Press, Inc., San Diego, Calif., 1987); Young and Davism, P.N.A.S, 80: 1194 (1983). Methods and apparatus for carrying out repeated and controlled hybridization reactions have been described in U.S. Pat. Nos. 5,871,928, 5,874,219, 6,045,996, 6,386,749, and 6,391,623, each of which is incorporated herein by reference.

The present invention also contemplates signal detection of hybridization between ligands in certain preferred embodiments. See U.S. Pat. Nos. 5,143,854, 5,578,832; 5,631,734; 5,834,758; 5,936,324; 5,981,956; 6,025,601; 6,141,096; 6,185,030; 6,201,639; 6,218,803; and 6,225,625; U.S. patent application Ser. No. 60/364,731; and PCT Application PCT/US99/06097 (published as WO99/47964), each of which also is hereby incorporated by reference in its entirety for all purposes.

Methods and apparatus for signal detection and processing of intensity data are disclosed in, for example, U.S. Pat. Nos. 5,143,854, 5,547,839, 5,578,832, 5,631,734, 5,800,992, 5,834,758; 5,856,092, 5,902,723, 5,936,324, 5,981,956, 6,025,601, 6,090,555, 6,141,096, 6,185,030, 6,201,639; 6,218,803; and 6,225,625, in U.S. patent application Ser. No. 60/364,731, and in PCT Application PCT/US99/06097 (published as WO99/47964), each of which also is hereby incorporated by reference in its entirety for all purposes.

The practice of the present invention may also employ conventional biology methods, software and systems. Computer software products of the invention typically include computer readable medium having computer-executable instructions for performing the logic steps of the method of the invention. Suitable computer readable medium include floppy disk, CD-ROM/DVD/DVD-ROM, hard-disk drive, flash memory, ROM/RAM, magnetic tapes and etc. The computer executable instructions may be written in a suitable computer language or combination of several languages. Basic computational biology methods are described in, e.g. Setubal and Meidanis et al., Introduction to Computational Biology Methods (PWS Publishing Company, Boston, 1997); Salzberg, Searles, Kasif, (Ed.), Computational Methods in Molecular Biology, (Elsevier, Amsterdam, 1998); Rashidi and Buehler, Bioinformatics Basics: Application in Biological Science and Medicine (CRC Press, London, 2000) and Ouelette and Bzevanis Bioinformatics: A Practical Guide for Analysis of Gene and Proteins (Wiley & Sons, Inc., 2nd ed., 2001).

The present invention may also make use of various computer program products and software for a variety of purposes, such as probe design, management of data, analysis, and instrument operation. See, for example, U.S. Pat. Nos. 5,593,839, 5,795,716, 5,733,729, 5,974,164, 6,066,454, 6,090,555, 6,185,561, 6,188,783, 6,223,127, 6,229,911 and 6,308,170, which are incorporated herein by reference.

Additionally, the present invention may have preferred embodiments that include methods for providing genetic information over networks such as the Internet as shown in U.S. patent applications Ser. Nos. 10/197,621, 10/065,868, 10/065,856, 10/063,559, 60/349,546, 60/376,003, 60/394,574, 60/403,381, each of which is incorporated herein by reference in its entirety for all purposes.

II. Glossary

The following terms are intended to have the following general meanings as used herein.

Nucleic acids according to the present invention may include any polymer or oligomer of pyrimidine and purine bases, preferably cytosine (C), thymine (T), and uracil (U), and adenine (A) and guanine (G), respectively. See Albert L. Lehninger, PRINCIPLES OF BIOCHEMISTRY, at 793–800 (Worth Pub. 1982). Indeed, the present invention contemplates any deoxyribonucleotide, ribonucleotide or peptide nucleic acid component, and any chemical variants thereof, such as methylated, hydroxymethylated or glucosylated forms of these bases, and the like. The polymers or oligomers may be heterogeneous or homogeneous in composition, and may be isolated from naturally occurring sources or may be artificially or synthetically produced. In addition, the nucleic acids may be deoxyribonucleic acid (DNA) or ribonucleic acid (RNA), or a mixture thereof, and may exist permanently or transitionally in single-stranded or double-stranded form, including homoduplex, heteroduplex, and hybrid states.

An "oligonucleotide" or "polynucleotide" is a nucleic acid ranging from at least 2, preferable at least 8, and more preferably at least 20 nucleotides in length or a compound that specifically hybridizes to a polynucleotide. Polynucleotides of the present invention include sequences of deoxyribonucleic acid (DNA) or ribonucleic acid (RNA), which may be isolated from natural sources, recombinantly produced, or artificially synthesized and mimetics thereof. A further example of a polynucleotide of the present invention may be peptide nucleic acid (PNA) in which the constituent bases are joined by peptides bonds rather than phosphodiester linkage, as described in Nielsen et al., Science 254:1497–1500 (1991), Nielsen Curr. Opin. Biotechnol., 10:71–75 (1999). The invention also encompasses situations in which there is a nontraditional base pairing such as Hoogsteen base pairing which has been identified in certain tRNA molecules and postulated to exist in a triple helix. "Polynucleotide" and "oligonucleotide" are used interchangeably in this application.

An "array" is an intentionally created collection of molecules which can be prepared either synthetically or biosynthetically. The molecules in the array can be identical or different from each other. The array can assume a variety of formats, e.g., libraries of soluble molecules; libraries of compounds tethered to resin beads, silica chips, or other solid supports.

A nucleic acid library or array is an intentionally created collection of nucleic acids which can be prepared either synthetically or biosynthetically in a variety of different formats (e.g., libraries of soluble molecules; and libraries of oligonucleotides tethered to resin beads, silica chips, or other solid supports). Additionally, the term "array" is meant to include those libraries of nucleic acids which can be prepared by depositing, synthesizing, or otherwise placing or building nucleic acids of essentially any length (e.g., from 1 to about 1000 nucleotide monomers in length) onto a substrate. The term "nucleic acid" as used herein refers to a polymeric form of nucleotides of any length, either ribonucleotides, deoxyribonucleotides or peptide nucleic acids (PNAs), that comprise purine and pyrimidine bases, or other natural, chemically or biochemically modified, non-natural, or derivatized nucleotide bases (see, e.g., U.S. Pat. No. 6,156,501, incorporated herein by reference). The backbone of the polynucleotide can comprise sugars and phosphate groups, as may typically be found in RNA or DNA, or modified or substituted sugar or phosphate groups. A polynucleotide may comprise modified nucleotides, such as methylated nucleotides and nucleotide analogs. The sequence of nucleotides may be interrupted by non-nucleotide components. Thus the terms nucleoside, nucleotide, deoxynucleoside and deoxynucleotide generally include analogs such as those described herein. These analogs are those molecules having some structural features in common with a naturally occurring nucleoside or nucleotide such that when incorporated into a nucleic acid or oligonucleotide sequence, they allow hybridization with a naturally occurring nucleic acid sequence in solution. Typically, these analogs are derived from naturally occurring nucleosides and nucleotides by replacing and/or modifying the base, the ribose or the phosphodiester moiety. The changes can be tailor made to stabilize or destabilize hybrid formation or enhance the specificity of hybridization with a complementary nucleic acid sequence as desired.

"Solid support", "support", and "substrate" are used interchangeably and refer to a material or group of materials having a rigid or semi-rigid surface or surfaces. In many embodiments, at least one surface of the solid support will be substantially flat, although in some embodiments it may be desirable to physically separate synthesis regions for different compounds with, for example, wells, raised regions, pins, etched trenches, or the like. According to other embodiments, the solid support(s) will take the form of beads, resins, gels, microspheres, or other geometric configurations.

Combinatorial Synthesis Strategy: A combinatorial synthesis strategy is an ordered strategy for parallel synthesis of diverse polymer sequences by sequential addition of reagents which may be represented by a reactant matrix and a switch matrix, the product of which is a product matrix. A reactant matrix is a 1 column by m row matrix of the building blocks to be added. The switch matrix is all or a subset of the binary numbers, preferably ordered, between 1 and m arranged in columns. A "binary strategy" is one in which at least two successive steps illuminate a portion, often half, of a region of interest on the substrate. In a binary synthesis strategy, all possible compounds which can be formed from an ordered set of reactants are formed. In most preferred embodiments, binary synthesis refers to a synthesis strategy which also factors a previous addition step. For example, a strategy in which a switch matrix for a masking strategy halves regions that were previously illuminated, illuminating about half of the previously illuminated region and protecting the remaining half (while also protecting about half of previously protected regions and illuminating about half of previously protected regions). It will be recognized that binary rounds may be interspersed with non-binary rounds and that only a portion of a substrate may be subjected to a binary scheme. A combinatorial "masking" strategy is a synthesis which uses light or other spatially selective deprotecting or activating agents to remove protecting groups from materials for addition of other materials such as amino acids. See, e.g., U.S. Pat. No. 5,143,854.

Monomer: refers to any member of the set of molecules that can be joined together to form an oligomer or polymer. The set of monomers useful in the present invention includes, but is not restricted to, for the example of (poly) peptide synthesis, the set of L-amino acids, D-amino acids, or synthetic amino acids. As used herein, "monomer" refers to any member of a basis set for synthesis of an oligomer. For example, dimers of L-amino acids form a basis set of 400 "monomers" for synthesis of polypeptides. Different basis sets of monomers may be used at successive steps in the synthesis of a polymer. The term "monomer" also refers to a chemical subunit that can be combined with a different chemical subunit to form a compound larger than either subunit alone.

Biopolymer or biological polymer: is intended to mean repeating units of biological or chemical moieties. Representative biopolymers include, but are not limited to, nucleic acids, oligonucleotides, amino acids, proteins, peptides, hormones, oligosaccharides, lipids, glycolipids, lipopolysaccharides, phospholipids, synthetic analogues of the foregoing, including, but not limited to, inverted nucleotides, peptide nucleic acids, Meta-DNA, and combinations of the above. "Biopolymer synthesis" is intended to encompass the synthetic production, both organic and inorganic, of a biopolymer.

Related to a bioploymer is a "biomonomer" which is intended to mean a single unit of biopolymer, or a single unit which is not part of a biopolymer. Thus, for example, a nucleotide is a biomonomer within an oligonucleotide biopolymer, and an amino acid is a biomonomer within a protein or peptide biopolymer; avidin, biotin, antibodies, antibody fragments, etc., for example, are also biomonomers. Initiation Biomonomer: or "initiator biomonomer" is meant to indicate the first biomonomer which is covalently attached via reactive nucleophiles to the surface of the polymer, or the first biomonomer which is attached to a linker or spacer arm attached to the polymer, the linker or spacer arm being attached to the polymer via reactive nucleophiles.

Complementary: Refers to the hybridization or base pairing between nucleotides or nucleic acids, such as, for instance, between the two strands of a double stranded DNA molecule or between an oligonucleotide primer and a primer binding site on a single stranded nucleic acid to be sequenced or amplified. Complementary nucleotides are, generally, A and T (or A and U), or C and G. Two single stranded RNA or DNA molecules are the to be complementary when the nucleotides of one strand, optimally aligned and compared and with appropriate nucleotide insertions or deletions, pair with at least about 80% of the nucleotides of the other strand, usually at least about 90% to 95%, and more preferably from about 98 to 100%. Alternatively, complementarity exists when an RNA or DNA strand will hybridize under selective hybridization conditions to its complement. Typically, selective hybridization will occur when there is at least about 65% complementarity over a stretch of at least 14 to 25 nucleotides, preferably at least about 75%, more preferably at least about 90% complementarity. See, M. Kanehisa Nucleic Acids Res. 12:203 (1984), incorporated herein by reference.

The term "hybridization" refers to the process in which two single-stranded polynucleotides bind non-covalently to form a stable double-stranded polynucleotide. The term "hybridization" may also refer to triple-stranded hybridization. The resulting (usually) double-stranded polynucleotide is a "hybrid." The proportion of the population of polynucleotides that forms stable hybrids is referred to herein as the "degree of hybridization".

Hybridization conditions will typically include salt concentrations of less than about 1M, more usually less than about 500 mM and less than about 200 mM. Hybridization temperatures can be as low as 5° C., but are typically greater than 22° C., more typically greater than about 30° C., and preferably in excess of about 37° C. Hybridizations are usually performed under stringent conditions, i.e. conditions under which a probe will hybridize to its target subsequence. Stringent conditions are sequence-dependent and are different in different circumstances. Longer fragments may require higher hybridization temperatures for specific hybridization. As other factors may affect the stringency of hybridization, including base composition and length of the complementary strands, presence of organic solvents and extent of base mismatching, the combination of parameters is more important than the absolute measure of any one alone. Generally, stringent conditions are selected to be about 5° C. lower than the thermal melting point (Tm) from the specific sequence at a defined ionic strength and pH. The Tm is the temperature (under defined ionic strength, pH and nucleic acid composition) at which 50% of the probes complementary to the target sequence hybridize to the target sequence at equilibrium.

Typically, stringent conditions include salt concentration of at least 0.01 M to no more than 1 M Na ion concentration (or other salts) at a pH 7.0 to 8.3 and a temperature of at least 25° C. For example, conditions of 5×SSPE (750 mM NaCl, 50 mM NaPhosphate, 5 mM EDTA, pH 7.4) and a temperature of 25–30° C. are suitable for allele-specific probe hybridizations. For stringent conditions, see for example, Sambrook, Fritsche and Maniatis. "Molecular Cloning A laboratory Manual" 2nd Ed. Cold Spring Harbor Press (1989) and Anderson "Nucleic Acid Hybridization" 1st Ed., BIOS Scientific Publishers Limited (1999), which are hereby incorporated by reference in its entirety for all purposes above.

Hybridization probes are nucleic acids (such as oligonucleotides) capable of binding in a base-specific manner to a complementary strand of nucleic acid. Such probes include peptide nucleic acids, as described in Nielsen et al., Science 254:1497–1500 (1991), Nielsen Curr. Opin. Biotechnol., 10:71–75 (1999) and other nucleic acid analogs and nucleic acid mimetics. See U.S. Pat. No. 6,156,501.

Probe: A probe is a molecule that can be recognized by a particular target. In some embodiments, a probe can be surface immobilized. Examples of probes that can be investigated by this invention include, but are not restricted to, agonists and antagonists for cell membrane receptors, toxins and venoms, viral epitopes, hormones (e.g., opioid peptides, steroids, etc.), hormone receptors, peptides, enzymes, enzyme substrates, cofactors, drugs, lectins, sugars, oligonucleotides, nucleic acids, oligosaccharides, proteins, and monoclonal antibodies.

Target: A molecule that has an affinity for a given probe. Targets may be naturally-occurring or man-made molecules. Also, they can be employed in their unaltered state or as aggregates with other species. Targets may be attached, covalently or noncovalently, to a binding member, either directly or via a specific binding substance. Examples of targets which can be employed by this invention include, but are not restricted to, antibodies, cell membrane receptors, monoclonal antibodies and antisera reactive with specific antigenic determinants (such as on viruses, cells or other materials), drugs, oligonucleotides, nucleic acids, peptides, cofactors, lectins, sugars, polysaccharides, cells, cellular membranes, and organelles. Targets are sometimes referred to in the art as anti-probes. As the term targets is used herein, no difference in meaning is intended. A "Probe Target Pair" is formed when two macromolecules have combined through molecular recognition to form a complex.

Ligand: A ligand is a molecule that is recognized by a particular receptor. In particular, the agent bound by or reacting with a receptor is called a "ligand," a term which is meaningful only in terms of its counterpart receptor. The term "ligand" does not imply any particular molecular size or other structural or compositional feature other than that the substance in question is capable of binding or otherwise interacting with the receptor. Also, a ligand may serve either as the natural ligand to which the receptor binds, or as a functional analogue that may act as an agonist or antagonist. Examples of ligands that can be investigated by this invention include, but are not restricted to, agonists and antagonists for cell membrane receptors, toxins and venoms, viral epitopes, hormones (e.g., opiates, steroids, etc.), hormone receptors, peptides, enzymes, enzyme substrates, substrate analogs, transition state analogs, cofactors, drugs, proteins, and antibodies.

Receptor: A molecule that has an affinity for a given ligand. Receptors may be naturally-occurring or manmade molecules. Also, they can be employed in their unaltered state or as aggregates with other species. Receptors may be attached, covalently or noncovalently, to a binding member, either directly or via a specific binding substance. Examples of receptors which can be employed by this invention include, but are not restricted to, antibodies, cell membrane receptors, monoclonal antibodies and antisera reactive with specific antigenic determinants (such as on viruses, cells or other materials), drugs, polynucleotides, nucleic acids, peptides, cofactors, lectins, sugars, polysaccharides, cells, cellular membranes, and organelles. Receptors are sometimes referred to in the art as anti-ligands. As the term "receptors" is used herein, no difference in meaning is intended. A "Ligand Receptor Pair" is formed when two macromolecules have combined through molecular recognition to form a complex. Other examples of receptors which can be investigated by this invention include but are not restricted to those molecules shown in U.S. Pat. No. 5,143,854, which is hereby incorporated by reference in its entirety.

Effective amount refers to an amount sufficient to induce a desired result.

mRNA or mRNA transcripts: as used herein, include, but are not limited to, pre-mRNA transcript(s), transcript processing intermediates, mature mRNA(s) ready for transcription and translation of the gene or genes, or nucleic acids derived from the mRNA transcript(s). Transcript processing may include splicing (possibly in alternative forms), editing and degradation. As used herein, a nucleic acid derived from an mRNA transcript refers to a nucleic acid for whose synthesis the mRNA transcript or a subsequence thereof has ultimately served as a template. Thus, a cDNA reverse transcribed from an mRNA, a cRNA transcribed from that cDNA, a DNA amplified from the cDNA, an RNA transcribed from the amplified DNA, etc., are all derived from the mRNA transcript and detection of such derived products is indicative of the presence and/or abundance of the original transcript in a sample. Thus, mRNA derived samples include, but are not limited to, mRNA transcripts of the gene or genes, cDNA reverse transcribed from the mRNA, cRNA transcribed from the cDNA, DNA amplified from the genes, RNA transcribed from amplified DNA, and the like.

A fragment, segment, or DNA segment refers to a portion of a larger DNA polynucleotide or DNA. A polynucleotide, for example, can be broken up, or fragmented into, a plurality of segments. Various methods of fragmenting nucleic acid are well known in the art. These methods may be, for example, either chemical or physical in nature. Chemical fragmentation may include partial degradation with a DNase; partial depurination with acid; the use of restriction enzymes; intron-encoded endonucleases; DNA-based cleavage methods, such as triplex and hybrid formation methods, that rely on the specific hybridization of a nucleic acid segment to localize a cleavage agent to a specific location in the nucleic acid molecule; or other enzymes or compounds which cleave DNA at known or unknown locations. Physical fragmentation methods may involve subjecting the DNA to a high shear rate. High shear rates may be produced, for example, by moving DNA through a chamber or channel with pits or spikes, or forcing the DNA sample through a restricted size flow passage, e.g., an aperture having a cross sectional dimension in the micron or submicron scale. Other physical methods include sonication and nebulization. Combinations of physical and chemical fragmentation methods may likewise be employed such as fragmentation by heat and ion-mediated hydrolysis. See for example, Sambrook et al., "Molecular Cloning: A Laboratory Manual," 3rd Ed. Cold Spring Harbor Laboratory Press, Cold Spring Harbor, N.Y. (2001) ("Sambrook et al.) which is incorporated herein by reference for all purposes. These methods can be optimized to digest a nucleic acid into fragments of a selected size range. Useful size ranges may be from 100, 200, 400, 700 or 1000 to 500, 800, 1500, 2000, 4000 or 10,000 base pairs. However, larger size ranges such as 4000, 10,000 or 20,000 to 10,000, 20,000 or 500,000 base pairs may also be useful. See, e.g., Dong et al., Genome Research 11, 1418 (2001), in U.S. Pat. No. 6,361,947, 6,391,592, incorporated herein by reference.

A primer is a single-stranded oligonucleotide capable of acting as a point of initiation for template-directed DNA synthesis under suitable conditions e.g., buffer and temperature, in the presence of four different nucleoside triphosphates and an agent for polymerization, such as, for example, DNA or RNA polymerase or reverse transcriptase. The length of the primer, in any given case, depends on, for example, the intended use of the primer, and generally ranges from 15 to 30 nucleotides. Short primer molecules generally require cooler temperatures to form sufficiently stable hybrid complexes with the template. A primer need not reflect the exact sequence of the template but must be sufficiently complementary to hybridize with such template. The primer site is the area of the template to which a primer hybridizes. The primer pair is a set of primers including a 5' upstream primer that hybridizes with the 5' end of the sequence to be amplified and a 3' downstream primer that hybridizes with the complement of the 3' end of the sequence to be amplified.

A genome is all the genetic material of an organism. In some instances, the term genome may refer to the chromosomal DNA. A genome may be multichromosomal such that the DNA is cellularly distributed among a plurality of individual chromosomes. For example, in human there are 22 pairs of chromosomes plus a gender associated XX or XY pair. DNA derived from the genetic material in the chromosomes of a particular organism is genomic DNA. The term genome may also refer to genetic materials from organisms that do not have chromosomal structure. In addition, the term genome may refer to mitochondria DNA. A genomic library is a collection of DNA fragments that represents the whole or a portion of a genome. Frequently, a genomic library is a collection of clones made from a set of randomly generated, sometimes overlapping DNA fragments representing the entire genome or a portion of the genome of an organism.

An allele refers to one specific form of a genetic sequence (such as a gene) within a cell or within a population, the specific form differing from other forms of the same gene in the sequence of at least one, and frequently more than one, variant sites within the sequence of the gene. The sequences at these variant sites that differ between different alleles are termed "variances", "polymorphisms", or "mutations". At each autosomal specific chromosomal location or "locus" an individual possesses two alleles, one inherited from the father and one from the mother. An individual is "heterozygous" at a locus if it has two different alleles at that locus. An individual is "homozygous" at a locus if it has two identical alleles at that locus.

Polymorphism refers to the occurrence of two or more genetically determined alternative sequences or alleles in a population. A polymorphic marker or site is the locus at which divergence occurs. Preferred markers have at least two alleles, each occurring at frequency of greater than 1%, and more preferably greater than 10% or 20% of a selected population. A polymorphism may comprise one or more base changes, an insertion, a repeat, or a deletion. A polymorphic locus may be as small as one base pair. Polymorphic markers include restriction fragment length polymorphisms, variable number of tandem repeats (VNTR's), hypervariable regions, minisatellites, dinucleotide repeats, trinucleotide repeats, tetranucleotide repeats, simple sequence repeats, and insertion elements such as Alu. The first identified allelic form is arbitrarily designated as the reference form and other allelic forms are designated as alternative or variant alleles. The allelic form occurring most frequently in a selected population is sometimes referred to as the wildtype form. Diploid organisms may be homozygous or heterozygous for allelic forms. A diallelic polymorphism has two forms. A triallelic polymorphism has three forms. Single nucleotide polymorphisms (SNPs) are included in polymorphisms.

Single nucleotide polymorphism (SNPs) are positions at which two alternative bases occur at appreciable frequency (>1%) in the human population, and are the most common type of human genetic variation. The site is usually preceded by and followed by highly conserved sequences of the allele (e.g., sequences that vary in less than $1/100$ or $1/1000$ members of the populations). A single nucleotide polymorphism usually arises due to substitution of one nucleotide for another at the polymorphic site. A transition is the replacement of one purine by another purine or one pyrimidine by another pyrimidine. A transversion is the replacement of a purine by a pyrimidine or vice versa. Single nucleotide polymorphisms can also arise from a deletion of a nucleotide or an insertion of a nucleotide relative to a reference allele.

Genotyping refers to the determination of the genetic information an individual carries at one or more positions in the genome. For example, genotyping may comprise the determination of which allele or alleles an individual carries for a single SNP or the determination of which allele or alleles an individual carries for a plurality of SNPs. A genotype may be the identity of the alleles present in an individual at one or more polymorphic sites.

Linkage disequilibrium or allelic association means the preferential association of a particular allele or genetic marker with a specific allele, or genetic marker at a nearby chromosomal location more frequently than expected by chance for any particular allele frequency in the population. For example, if locus X has alleles a and b, which occur equally frequently, and linked locus Y has alleles c and d, which occur equally frequently, one would expect the combination ac to occur with a frequency of 0.25. If ac occurs more frequently, then alleles a and c are in linkage disequilibrium. Linkage disequilibrium may result from natural selection of certain combination of alleles or because an allele has been introduced into a population too recently to have reached equilibrium with linked alleles. A marker in linkage disequilibrium can be particularly useful in detecting susceptibility to disease (or other phenotype) notwithstanding that the marker does not cause the disease. For example, a marker (X) that is not itself a causative element of a disease, but which is in linkage disequilibrium with a gene (including regulatory sequences) (Y) that is a causative element of a phenotype, can be detected to indicate susceptibility to the disease in circumstances in which the gene Y may not have been identified or may not be readily detectable.

III. Direct Write Optical Lithography System

Direct Write Optical Lithography System may provide flexibility for polymer array synthesis by providing a maskless optical lithography system and method where predetermined image patterns can be dynamically changed during photolithographic processing. Maskless lithographic systems are particularly useful for rapid product prototyping. In such application, a polymer array is designed and then synthesized using maskless lithography. The polymer array may be tested for its performance. Several designs can be compared. If a design is acceptable, maskless can be made according to the design to produce a large number of polymer arrays.

An optical lithography system is provided to include a means for dynamically changing an intended image pattern without using a photomask. One such means includes a spatial light modulator that is electronically controlled by a computer to generate unique predetermined image patterns at each photolithographic step in polymer array synthesis. The spatial light modulators can be, for example, micromachined mechanical modulators or microelectronic devices (e.g. liquid crystal display (LCD)). The Direct Write System of the present invention using such spatial light modulators is particularly useful in the synthesis of polymer arrays, such as polypeptide, carbohydrate, and nucleic acid arrays. Nucleic acid arrays typically include polynucleotides or oligonucleotides attached to glass, for example, Deoxyribonucleic Acid (DNA) arrays.

Certain preferred embodiments of the invention involve use of the micromachined mechanical modulators to direct the light to predetermined regions (i.e., known areas on a substrate predefined prior to photolithography processing) of the substrate on which the polymers are being synthesized. The predetermined regions of the substrate associated with, for example, one segment (referred to herein as a pixel) of a micromachined mechanical modulator (e.g., a micro-mirror array) are referred to herein as features. In each predetermined region or feature a particular oligonucleotide sequence, for example, is synthesized. The mechanical modulators come in a variety of types, two of which will be discussed in some detail below.

One type of mechanical modulator is a micro-mirror array which uses small metal mirrors to selectively reflect a light beam to particular individual features; thus causing the individual features to selectively receive light from a light source (i.e., turning light on and off of the individual features). An example is the programmable micro-mirror array Digital Micromirror Device (DMD™) manufactured by Texas Instruments, Inc., Dallas, Tex., USA. Texas Instruments markets the arrays primarily for projection display applications (e.g., big-screen video) in which a highly magnified image of the array is projected onto a wall or screen. The present invention shows, however, that with appropriate optics and an appropriate light source, a programmable micro-mirror array can be used for photolithographic synthesis, and in particular for polymer array synthesis.

The Texas Instruments DLP™ technology can be used to make digital micromirrors of different resolutions. Some arrays are designed to be illuminated 20 degrees off axis. Each mirror can be turned on (tilted 10 degrees in one direction) or off (tilted 10 degrees in the other direction). A lens (on axis) images the array onto a target. When a micro-mirror is turned on, light reflected by the micro-mirror passes through the lens and the image of the micro-mirror appears bright. When a micro-mirror is turned off, light reflected by the micro-mirror misses the lens and the image of the micro-mirror appears dark. The array can be reconfigured by software (i.e., every micro-mirror in the array can be turned on or off as desired) in a fraction of a second.

An optical lithography system including a micro-mirror array 1 based spatial light modulator according to one embodiment of the invention is shown in FIG. 1. This embodiment includes a spatial light modulator made of a micro-mirror array 1, and arc lamp 3, and a lens 2 to project a predetermined image pattern on a chip or wafer (containing many chips) 4. In operation, collimated, filtered and homogenized light 5 from the arc lamp 3 is selectively reflected as a light beam 6 according to dynamically turned on micro mirrors in the micro-mirror array 1 and transmitted through lens 2 on to chip or wafer 4 as reflected light beam 8. Reflected light from micro-mirrors that are turned off 7 is reflected in a direction away from the lens 2 so that these areas appear dark to the lens 2 and chip or wafer 4. Thus, the spatial light modulator, micro-mirror array 1, modulates the direction of reflected light (6 and 7) so as to define a predetermined light image 8 projected onto the chip or wafer 4. The direction of the reflected light alters the light intensity transmitted from each pixel to each feature. In essence, the spatial light modulator operates as a directional and intensity modulator. The micro-mirror array 1 can be provided by, for example, the micro-mirror array of the Texas Instruments (TI) DMD, in particular, the TI SVGA DLP™ subsystem. The Texas Instruments SVGA DLP® subsystem with optics may be modified for use in the present invention. The Texas Instruments SVGA DLP™ subsystem includes a micro-mirror array (shown as micro-mirror array 1 in FIG. 1), a light source, a color filter wheel, a projection lens, and electronics for driving the array and interfacing to a computer. The color filter wheel is replaced with a bandpass filter having, for example, a bandpass wavelength of 365–410 (wavelength dependent upon the type of photochemicals selected for used in the process). For additional brightness at wavelengths of, for example, 400–410the light source can be replaced with arc lamp 3 and appropriate homogenizing and collimating optics. The lens included with the device is intended for use at very large conjugate ratios and is replaced with lens 2 or set of lenses appropriate for imaging the micro-mirror array 1 onto chip or wafer 4 with the desired magnification. Selection of the appropriate lens and bandpass filter is dependent on, among other things, the requisite image size to be formed on the chip, the type of spatial light modulator, the type of light source, and the type of photoresist and photochemicals being used in the system and process.

A symmetric lens system (e.g., lenses arranged by type A-B-C-C-B-A) used at 1:1 magnification (object size is the same as the image size) is desirable because certain aberrations (distortion, lateral color, coma) are minimized by symmetry. Further, a symmetric lens system results in a relatively simple lens design because there are only half as many variables as in an asymmetric system having the same number of surfaces. However, at 1:1 magnification the likely maximum possible chip size is 10.888.16with a VGA device, or 10.213.6with an SVGA device. Synthesis of, for example, a standard GeneChip® 12.8 mm chip uses an asymmetric optical system (e.g., a magnification of about 1.25:1 with SVGA device) or a larger micro-mirror array (e.g., 1028mirrors) if the mirror size is constant. In essence, the lens magnification can be greater than or less than 1 depending on the desired size of the chip.

In certain applications of the invention, a relatively simple lens system, such as a back-to-back pair of achromats or camera lens, is adequate. A particularly useful lens for some applications of the invention is the Rodenstock (Rockford, Ill.) Apo-Rodagon D. This lens is optimized for 1:1 imaging and gives good performance at magnifications up to about 1.3:1. Similar lenses may be available from other manufacturers. With such lenses, either the Airy disk diameter or the blur circle diameter will be rather large (maybe 10or larger). See Modem Optical Engineering, 2d Edition, Smith, W. J., ed., McGraw-Hill, Inc., New York (1990). For higher-quality synthesis, the feature size is several times larger than the Airy disk or blur circle. Therefore, a custom-made lens with resolution of about 1–2 over a 12.8field is particularly desirable.

A preferred embodiment of synthesizing polymer arrays with a programmable micro-mirror array using the DMT process with photoresist takes place as follows. First, a computer file is generated and specifies, for each photolithography step, which mirrors in the micro-mirror array 1 need to be on and which need to be off to generate a particular predetermined image pattern. Next, the individual chip or the wafer from which it is made 4 is coated with photoresist on the synthesis surface and is mounted in a holder or flow cell (not shown) on the photolithography apparatus so that the synthesis surface is in the plane where the image of the micro-mirror array 1 will be formed. The photoresist may be either positive or negative thus allowing deprotection at locations exposed to the light or deprotection at locations not exposed to the light, respectively (example photoresists include: negative tone SU-8 epoxy resin (Shell Chemical) and those shown in the above cited patents and U.S. Pat. No. 5,959,098). A mechanism for aligning and focusing the chip or wafer is provided, such as a x-y translation stage. Then, the micromirror array 1 is programmed for the appropriate configuration according to the desired predetermined image pattern, a shutter in the arc lamp 3 is opened, the chip or wafer 4 is illuminated for the desired amount of time, and the shutter is closed. If a wafer (rather than a chip) is being synthesized; a stepping-motor-driven translation stage moves the wafer by a distance equal to the desired center-to-center distance between chips and the shutter of the arc lamp 3 is opened and closed again, these two steps being repeated until each chip of the wafer has been exposed.

Next, the photoresist is developed and etched. Exposure of the wafer 4 to acid then cleaves the DMT protecting groups from regions of the wafer where the photoresist has been removed. The remaining photoresist is then stripped. Then DMT-protected nucleotides containing the desired base (adenine (A), cytosine (C), guanine (G), or thymine (T)) are coupled to the deprotected oligonucleotides.

Subsequently, the chip or wafer 4 is re-coated with photoresist. The steps from mounting the photoresist coated chip or wafer 4 in a holder through re-coating the chip or wafer 4 with photoresist are repeated until the polymer array synthesis is complete.

As is clear from the above described method for polymer array synthesis, no photomasks are needed. This simplifies the process by eliminating processing time associated with changing masks in the optical lithography system and reduces the manufacturing cost for polymer array synthesis by eliminating the cost of the masks as well as processing defects associated with using masks. In addition, the process has improved flexibility because reprogramming the optical lithography system to produce a different image pattern can be done with relatively little lead time compared with the time it takes to generate and verify new photomasks, thus making it possible to transfer an image pattern computer file directly from a CAD or similar system to the optical lithography system or providing electronic signals directly from the CAD system to drive the optical lithography system's means for dynamically producing the desired light pattern (e.g., spatial light modulator). Therefore, the optical lithography system is simplified and more efficient than conventional photomask based optical lithography systems. This is particularly valuable in complex multiple step photolithography processing; for example polymer array synthesis of GeneChip® probe arrays having upwards of seventy or more cycles, especially when many different products are made and revised.

When synthesizing nucleic acid arrays, the photochemical processes used to fabricate the arrays is preferably activated with light having a wavelength greater than 365 to avoid photochemical degradation of the polynucleotides used to create the polymer arrays. Other wavelengths may be desirable for other probes. Many photoacid generators (PAGs) based on o-nitrobenzyl chemistry are useful at 365 Further, when using the mirror array from Texas Instruments discussed above, the PAG is preferably sensitive above 400 to avoid damage to the mirror array. To achieve this, p-nitrobenzyl esters can be used in conjunction with a photosensitizer. For example, p-nitrobenzyltosylate and 2-ethyl-9,10-dimethoxy-anthracene can be used to photochemically generate toluenesulfonic acid at 405 See S.C. Busman and J. E. Trend, J. Imag. Technol., 1985, 11, 191; A. T. and O. J.Chem., 1988, 53, 3386. In this system, the sensitizer absorbs the light and then transfers the energy to the p-nitrobenzyltosylate, causing dissociation and the subsequent release of toluensulfonic acid. Alternate sensitizers, such as pyrene, N,N-dimethylnapthylamine, perylene, phenothiazine, canthone, thiocanthone, actophenone, and benzophenone that absorb light at other wavelengths are also useful.

A variety of photoresists sensitive to 436-nm light are available for use in polymer array synthesis and will avoid photochemical degradation of the polynucleotides.

A second preferred mechanical modulator that may be used in the invention is the Grating Light Valve™ (GLV™) available from Silicon LightMachines, Sunnyvale, Calif., USA. The GLV™ relies on micromachined pixels that can be programmed to be either reflective or diffractive (Grating Light Valve™ technology). Information regarding certain of the mechanical modulators discussed herein is obtained at http://www.ti.com (Texas instruments) and http://siliconlight.com. (Silicon LightMachines).

Although preferred spatial light modulators include the mechanical modulators DMD™ available from Texas Instruments and the GLV™ available from Silicon LightMachines, various types of spatial light modulators exist and may be used in the practice of the present invention. See Electronic Engineers Handbook, 3rd Ed., Fink, D. G. and Christiansen, D. Eds., McGraw-Hill Book Co., New York (1989). Deformable membrane mirror arrays are available from Optron Systems Inc. (Bedford, Mass.). Liquid-crystal spatial light modulators are available from Hamamatsu (Bridgewater, N.J.), Spatialight (Novato, Calif.), and other companies. However, one skilled in the art must be careful to select the proper light source and processing chemistries to ensure that the liquid-crystal spatial light modulator is not damaged since these devices may be susceptible to damage by various ultraviolet (UV) light. Liquid-crystal displays (LCD; e.g., in calculators and notebook computers) are also spatial light modulators useful for photolithography particularly to synthesize large features. However, reduction optics would be required to synthesize smaller features using LCDs.

Figure 2:
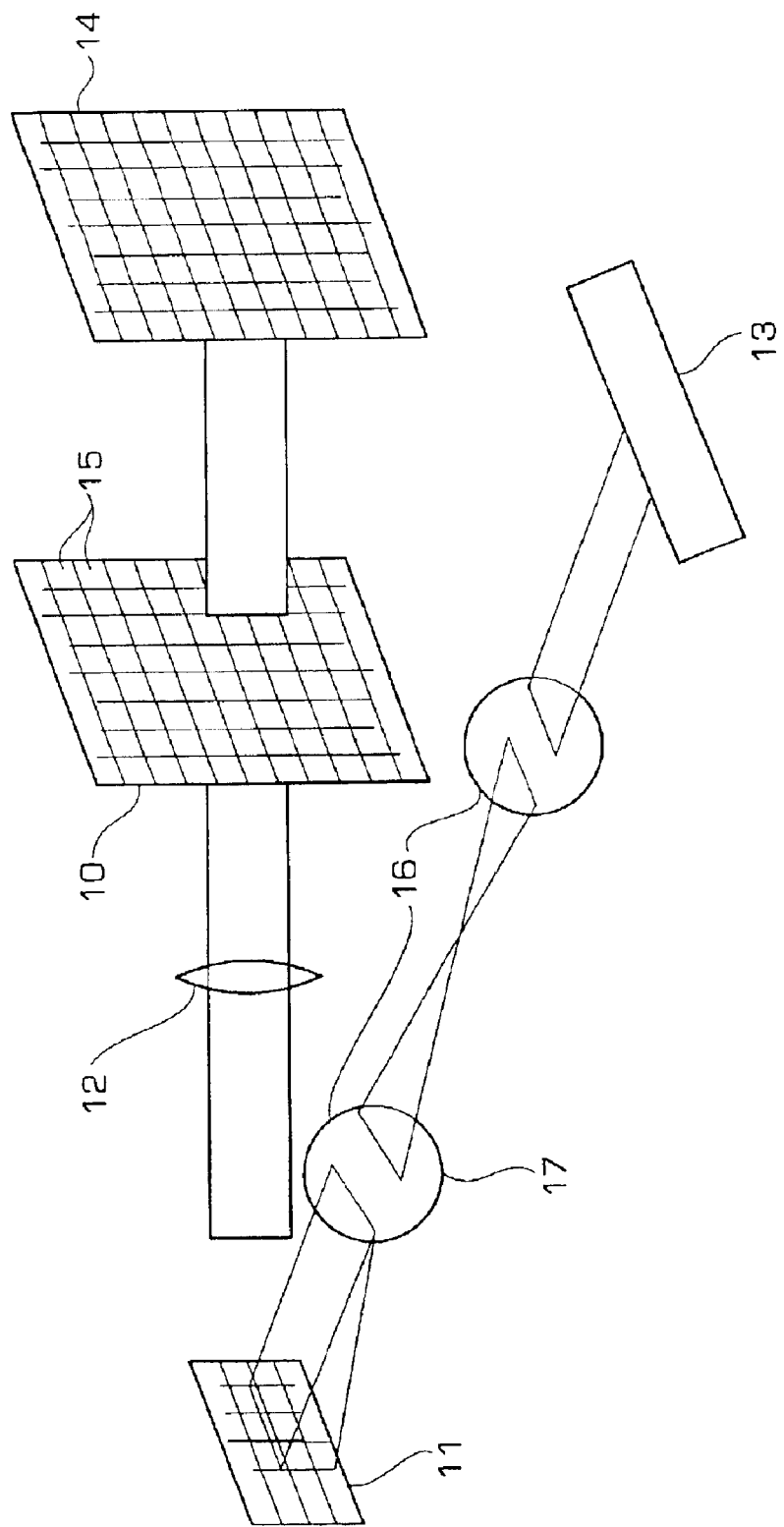
FIG. 2 is a diagrammatic representation of a second embodiment of the invention employing an array of, for example, micro-lenses.
Figure 3:
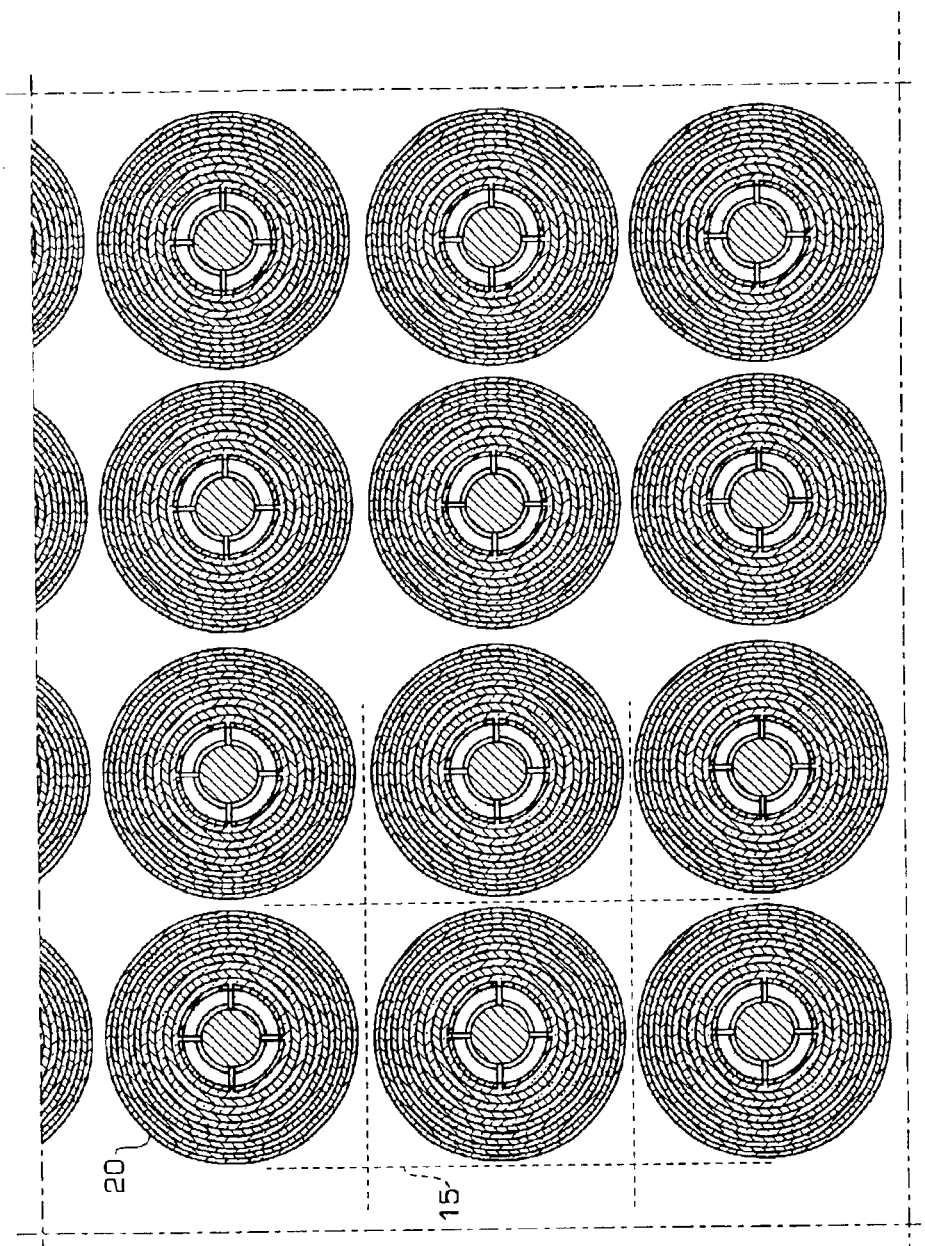
FIG. 3 illustrates a micro-lens array in the form of Fresnel Zone Plates, which may be used in the invention.

One embodiment that is particularly useful for extremely high resolution involves imaging the micro-mirror array using a system of the type shown in FIG. 2. In this system, a lens 12 images the micro-mirror array 11 (e.g., DMD™ or GLV™) onto an array 10 having an array of micro-lenses 15 or non-imaging light concentrators. Each element of the array 10 focuses light onto the chip or wafer, e.g., Gene Chip array 14. Each micro-lens 15 produces an image of one pixel of the micro-mirror array 11. Optics 16, including a shaping lens 17 may be included to translate light from a light source 13 onto the micro-mirror array 11.

For example, if an SVGA DLP™ device is imaged with 1:1 magnification onto a micro-lens array 10, an appropriate micro-lens array 10 can consist of 800600 lenses (micro-lenses 15) with 17 $\mu$m center-to-center spacing. Alternatively, the micro-lens array can consist of 400×300 17 $\mu$m diameter lenses with 34 $\mu$m center-to-center spacing, and with opaque material (e.g., chrome) between micro-lenses 15. One advantage of this alternative is that cross-talk between pixels is reduced. The light incident upon each micro-lens 15 can be focused to a spot size of 1–2 $\mu$m. Because the spot size is much less than the spacing between micro-lenses, a 2-axis translation stage (having, in these examples, a range of travel of at least either 17 $\mu$m×17 $\mu$m or 34 $\mu$m×34 $\mu$m) is necessary if complete coverage of the chip or wafer 14 is desired.

Micro-lenses 15 can be diffractive, refractive, or hybrid (diffractive and refractive). Refractive micro-lenses can be conventional or gradient-index. A portion of a diffractive micro-lens array 10 is shown in Figure and has individual micro-lenses formed as circles commonly known as Fresnel Zone Plates 20. Alternatively an array of non-imaging light concentrators can be employed. An example of such an approach would include a short piece of optical fiber which may be tapered to a small tip.

Figure 4:
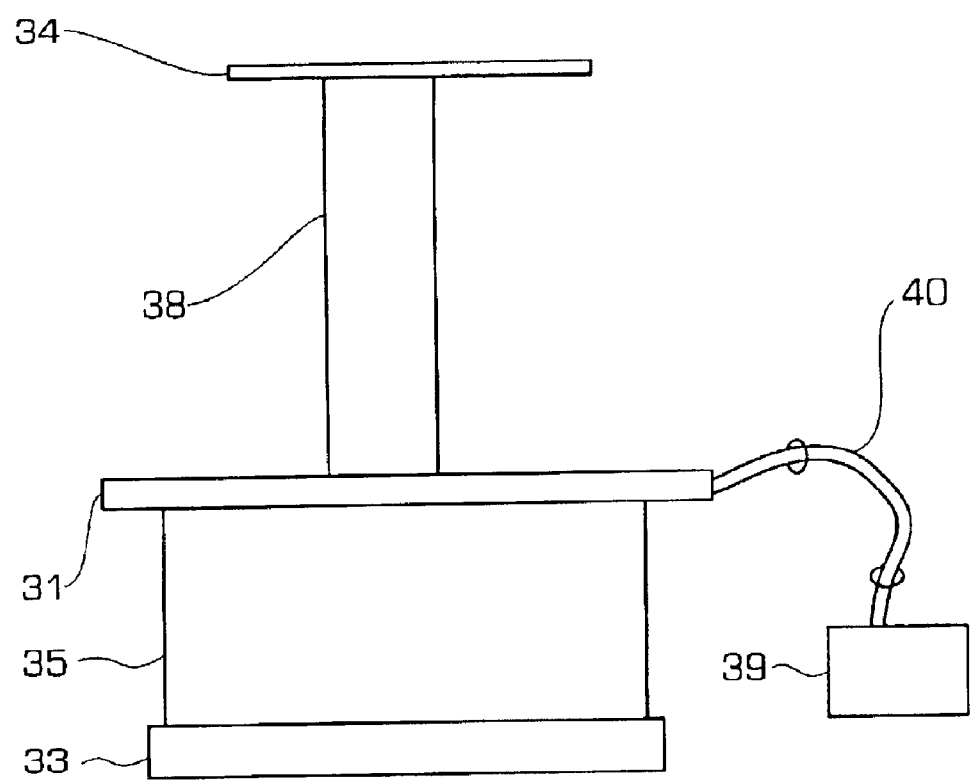
FIG. 4 shows a third embodiment of the invention having a transmissive spatial light modulator.

Furthermore, some spatial light modulators are designed to modulate transmitted rather than reflected light. An example of a transmissive spatial light modulator is a liquid crystal display (LCD) and is illustrated in another embodiment, shown in FIG. 4. This embodiment includes a light source 33 providing light 35, transmissive spatial light modulator 31 and a computer 39 providing electronic control signals to the transmissive spatial light modulator 31 through cables 40 so as to transmit a desired light image 38 on the chip or wafer 34. The computer 39 may be, for example, a unique programmable controller, a personal computer (PC), or a CAD system used to design the desired image pattern. Using a transmissive spatial light modulator has even additional advantages over the conventional optical lithography system. Reflective spatial light modulators require a large working distance between the modulator and the lens so that the lens does not block the incident light. Designing a high performance lens with a large working distance is more difficult than designing a lens of equivalent performance with no constraints on the working distance. With a transmissive spatial light modulator the working distance does not have to be long and lens design is therefore easier. In fact, as show in FIG. 4, some transmissive spatial light modulators 31 might be useful for proximity or contact printing with no lens at all, by locating the modulator very close to the chip or wafer 34. In fact, the transmissive spatial light modulator in the embodiment of FIG. 4 could be replaced by an LED array or a semiconductor laser arrays emitting light of the appropriate wavelength, each of which not only may be operated to dynamically define a desired image but also act as the light source. Thus, as modified, this embodiment would be simplified so as to not require a separate light source.

Figure 5A:
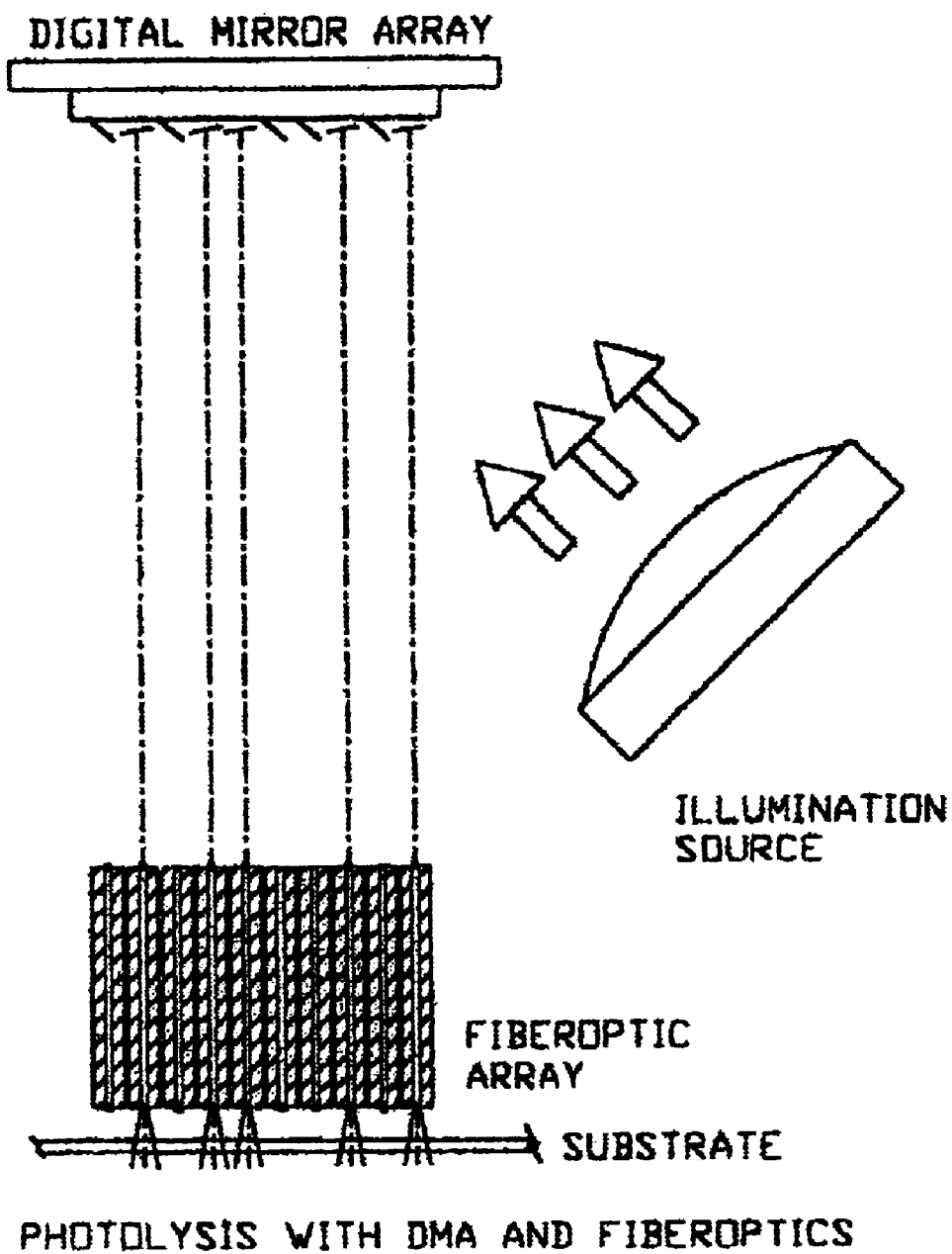
FIGS. 5A and 5B shows an exemplary photodirected synthesis system with digital micromirror and fiberoptics.
Figure 5B:
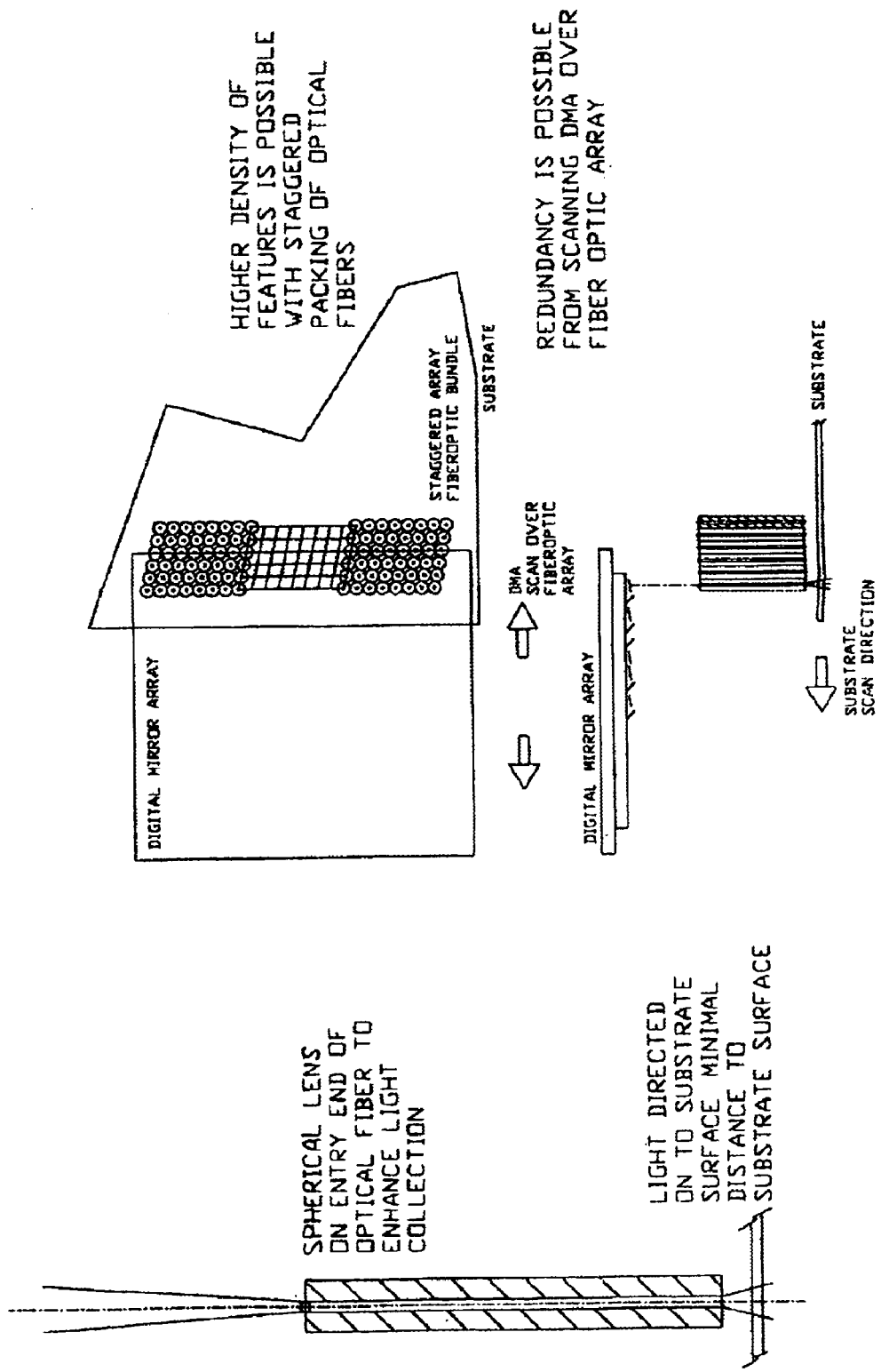

In another embodiment, the use of fiber optic arrays or bundles as a light guide to transmit ultraviolet light to the substrate surface. FIGS. 5A and 5B shows a representation of an exemplary lithography system using fiber optic arrays.

The Digital Micromirror Array (DMA) is used as a switching device to reflect light onto the entry side of the fiber optic array. Since the DMA can selectively reflect light at individual mirrors or pixels, only specific fiber elements will be illuminated. The light that exits the other end of the fiber array will illuminate selected locations on the substrate.

Even though the diameters of some commercially available fiber elements, (5–10 um, with 20 um cladding) have relatively large diameter (the density of the pixels from DMA devices is considerably higher (14 um square)), if the substrate is positioned very close to the end of the fiber optic arrays, 5–10 um features can be produced.

In some embodiments, the use of spherical lens on the entry and exit ends of the fibers can enhance the collection and focus of light as well. On the entry end, the relative narrow collection angle of a conventional fiber may not be efficient enough to transmit sufficient light intensity to the substrate surface. On the exit end of the fiber a large angle of light scatter is typically expected. The addition of spherical lenses bonded to a concave surface on the end of the fiber may be beneficial.

Another consideration involves the relative density or packing of features that can be possible with fiber optics. With the relatively large cladding diameters the closest adjoining features may be 20 um apart. However, if a staggered array of fiber elements is created and a scanning technique is used to translate the fiber bundle across the substrate, feature spacing can be reduced (5–10 um or smaller).

In exemplary embodiments for scanning include moving the DMA, fiber optic array or substrate relative to each other. FIG. 5B shows one such embodiment. In some embodiments, it may be beneficial to control the sequence timing and spatial coordinates of the light switching by the DMA relative to the other translating components.

It is to be understood that the above description is intended to be illustrative and not restrictive. Many variations of the invention will be apparent to those of skill in the art upon reviewing the above description. The scope of the invention should be determined with reference to the appended claims, along with the full scope of equivalents to which such claims are entitled. All cited references, including patent and non-patent literature, are incorporated herewith by reference in their entireties for all purposes.

What is claimed is:

1. A method for deprotecting reaction sites on a substrate comprising:
   providing a substrate having protected reaction sites for polymer synthesis; and
   transmitting a predetermined light pattern through a fiber optic array or bundle as a light guide to the substrate so as to generate a corresponding predetermined light pattern on the substrate, wherein the light pattern comprises at least one bright section and at least one dark section, to deprotect selected portions of the protected reaction sites to add a monomer on the deprotected selected portions.

2. The method of claim 1 wherein the light pattern is generated using a digital micromirror.

3. The method of claim 2 wherein the reaction sites are protected by a chemical protecting group.

4. The method of claim 2 wherein the reaction sites are protected by a photoresist.

5. The method of claim 4 wherein the photoresist is a positive photoresist.

6. The method of claim 4 wherein the photoresist is a negative photoresist.

7. The method of claim 1 wherein the fiber optic array comprises spherical lens on the entry and exit ends of the fibers.

8. The method of claim 1 wherein the fiber optic array comprises a staggered array of fiberoptic elements.

9. The method of claim 8 wherein the fiber optic array is translated across the substrate.

10. A method for synthesizing an oligonucleotide probe array comprising:
    controlling a digital micromirror to generate a predetermined light pattern, wherein the light pattern comprises at least one bright section and at least one dark section;
    using a fiber optic array as a light guide to direct the corresponding light pattern onto a substrate to deprotect a plurality of reaction sites for polymer synthesis to obtain a plurality of deprotected sites; and
    coupling a monomer to the deprotected sites.

11. The method of claim 10 wherein the reaction sites are protected by a chemical protecting group.

12. The method of claim 10 wherein the reaction sites are protected by a photoresist.

13. The method of claim 12 wherein the photoresist is a positive photoresist.

14. The method of claim 12 wherein the photoresist is a negative photoresist.

15. The method of claim 10 wherein the fiber optic array comprises spherical lens on the entry and exit ends of the fibers.

16. The method of claim 10 wherein the fiber optic array comprises a staggered array of fiberoptic elements.

17. The method of claim 16 wherein the fiber optic array is translated across the substrate.

* * * * *